(12) United States Patent
Park

(10) Patent No.: US 12,040,786 B2
(45) Date of Patent: Jul. 16, 2024

(54) SIGNAL PROCESSING DEVICE AND IMAGE DISPLAY DEVICE COMPRISING SAME

(71) Applicant: LG ELECTRONICS INC., Seoul (KR)

(72) Inventor: Byoungsun Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 28 days.

(21) Appl. No.: 17/904,368

(22) PCT Filed: Feb. 18, 2020

(86) PCT No.: PCT/KR2020/002278
§ 371 (c)(1),
(2) Date: Aug. 16, 2022

(87) PCT Pub. No.: WO2021/167114
PCT Pub. Date: Aug. 26, 2021

(65) Prior Publication Data
US 2023/0059987 A1    Feb. 23, 2023

(51) Int. Cl.
*G09G 5/00*    (2006.01)
*G05F 1/10*    (2006.01)
(Continued)

(52) U.S. Cl.
CPC ....... *H03K 17/6242* (2013.01); *G09G 3/2092* (2013.01); *G09G 2330/028* (2013.01);
(Continued)

(58) Field of Classification Search
CPC . G06F 3/038; G05F 1/10; G05F 1/575; G05F 1/595; H03M 1/08; H04B 1/16;
(Continued)

(56) References Cited

U.S. PATENT DOCUMENTS 8,860,469 B1    10/2014 Ding et al.
2008/0238482 A1    10/2008 Tian et al.
(Continued)

FOREIGN PATENT DOCUMENTS

KR    1020110003725    1/2011
KR    101884291    7/2018

OTHER PUBLICATIONS

PCT International Application No. PCT/KR2020/002278, International Search Report dated Nov. 17, 2020, 3 pages.

*Primary Examiner* — Chanh D Nguyen
*Assistant Examiner* — Nguyen H Truong
(74) *Attorney, Agent, or Firm* — LEE, HONG, DEGERMAN, KANG & WAIMEY

(57) ABSTRACT

An image display apparatus is disclosed. The image display apparatus includes a signal processing device having a transceiver that includes a current sweep circuit configured to output a plurality of sweep currents, a current selector connected to the current sweep circuit and configured to select a predetermined current from the plurality of sweep currents based on comparison with a reference voltage, and a comparator configured to compare a voltage output from the current selector with the reference voltage. Accordingly, a constant output voltage level can be obtained.

19 Claims, 24 Drawing Sheets

(51) Int. Cl.
*G09G 3/20* (2006.01)
*H03K 17/62* (2006.01)
*H03K 19/003* (2006.01)

(52) U.S. Cl.
CPC ..... *G09G 2370/20* (2013.01); *G09G 2370/22* (2013.01); *H03K 2217/94026* (2013.01)

(58) Field of Classification Search
CPC .... H03G 3/30; H03G 5/16; H03F 1/26; H03F 3/45; H03F 3/68; H03F 3/19; G01R 31/3187; G01R 35/00; H05B 33/08; H05B 37/02; H05B 45/37; H05B 45/50; H02J 1/00; H02J 7/00; H02J 7/34; H02J 15/00; H03K 3/00; H03K 5/01; H03K 5/22; H03K 5/24; H03K 7/08; H03K 17/02; H03K 17/16; H03K 17/6242; H03K 19/00; H03K 19/003; H03K 19/0175; H03K 2217/94026; G09G 3/10; G09G 3/20; G09G 3/30; G09G 3/32; G09G 3/34; G09G 3/36; G09G 3/2092; G09G 5/00; G09G 2330/028; G09G 2370/20; G09G 2370/22; H04L 27/01; H03B 1/00

See application file for complete search history.

(56) References Cited

U.S. PATENT DOCUMENTS

| | | | |
|---|---|---|---|
| 2011/0050280 A1* | 3/2011 | Maddux | G11C 29/025 326/82 |
| 2013/0257397 A1* | 10/2013 | Chang | G09G 5/006 323/265 |
| 2019/0094896 A1 | 3/2019 | Maruyama | |

\* cited by examiner the present disclosure relates to an image display apparatus, and more specifically, to a signal processing device capable of having a constant output voltage level, and an image display apparatus including the same.

SIGNAL PROCESSING DEVICE AND IMAGE DISPLAY DEVICE COMPRISING SAME

CROSS-REFERENCE TO RELATED APPLICATION(S)

This application is the National Stage filing under 35 U.S.C. 371 of International Application No. PCT/KR2020/002278, filed on Feb. 18, 2020, the contents of which are all incorporated by reference herein in its entirety.

BACKGROUND

1. Field

The present disclosure relates to an image display apparatus, and more specifically, to a signal processing device capable of having a constant output voltage level, and an image display apparatus including the same.

2. Description of the Related Art

A signal processing device is a device that is included in an image display apparatus and performs signal processing on an input image so as to display an image.

For example, the signal processing device may receive a broadcast signal or an HDMI signal, performs signal processing based on the received broadcast or HDMI signal, and output a processed image signal.

As another example, the signal processing device receives a signal from an Ethernet terminal or transmits a signal thereto.

Meanwhile, the signal processing device is implemented in the form of a system-on-chip (SOC) for processing of various signals.

For advancement of such an SOC, semiconductor processes are used, and in particular, a CMOS process, which is one of semiconductor processes, is gradually being advanced over time.

Meanwhile, since power consumption of a signal transceiver connected to the Ethernet terminal increases as a signal transmission rate increases, various efforts are being made to reduce power consumption.

Accordingly, power consumption is reduced in a voltage mode than in a current mode in a signal transceiver, but the level of an output voltage is not constant or a swing level varies due to variation in a bias or transistors.

SUMMARY

Therefore, the present disclosure has been made in view of the above problems, and it is an object of the present disclosure to provide a signal processing device capable of having a constant output voltage level, and an image display apparatus including the same.

It is another object of the present disclosure to provide a signal processing device capable of maintaining a constant swing level, and an image display apparatus including the same.

In accordance with the present disclosure, the above and other objects can be accomplished by the provision of a signal processing device and an image display apparatus including the same, the signal processing device including a transceiver, wherein the transceiver includes a current sweep circuit configured to output a plurality of sweep currents, a current selector connected to the current sweep circuit and configured to select a predetermined current from the plurality of sweep currents based on comparison with a reference voltage, and a comparator configured to compare a voltage output from the current selector with the reference voltage.

Effects of the Disclosure

A signal processing device and an image display apparatus including the same according to an embodiment of the present disclosure includes a transceiver including a current sweep circuit configured to output a plurality of sweep currents, a current selector connected to the current sweep circuit and configured to select a predetermined current from the plurality of sweep currents based on comparison with a reference voltage, and a comparator configured to compare a voltage output from the current selector with the reference voltage. Accordingly, it is possible to achieve a constant output voltage level despite variation in a bias or transistors. In addition, it is possible to maintain a constant swing level of an output voltage.

The transceiver further may include a resistor connected between an output terminal of the current selector and a ground terminal, and a switch configured to perform switching. Accordingly, it is possible to achieve a constant output voltage level.

The comparator may compare voltages corresponding to a current output from the current selector and a resistance value of the resistor with the reference voltage and feed back a comparison result to the current selector. Accordingly, it is possible to select an optimal current.

The current sweep circuit may sequentially output the plurality of sweep currents in a calibration mode. Accordingly, it is possible to select an optimal current.

The transceiver may further include a digital-to-analog conversion circuit configured to output a sweep current from the current sweep circuit in the calibration mode and to convert and output transmission data after the calibration mode is terminated. Accordingly, it is possible to achieve a constant output voltage level after the calibration mode is terminated based on selection of an optimal current.

The transceiver may further include a current output module configured to output the current selected by the current selector in the calibration mode after the calibration mode is terminated. Accordingly, it is possible to achieve a constant output voltage level after the calibration mode is terminated based on selection of an optimal current.

The transceiver may further include a switch configured to switch the current output from the current selector or the current output module, and a voltage driver operating in a voltage mode based on the current output from the current selector or the current output module. Accordingly, it is possible to achieve a constant output voltage level based on selection of an optimal current.

The transceiver may further include a voltage generator including a resistor connected between the output terminal of the current selector and a ground terminal and a switch configured to perform switching, and a second voltage generator including a second resistor connected between an output terminal of the current output module and the ground terminal and a second switch configured to perform switching. Accordingly, it is possible to achieve a constant output voltage level after the calibration mode is terminated based on selection of an optimal current.

The current selector and the current sweep circuit may stop operations thereof after the calibration mode is terminated. Accordingly, it is possible to reduce power consumption by the current selector and the current sweep circuit after the calibration mode is terminated.

The transceiver may further include a voltage driver disposed at an output terminal of the digital-to-analog conversion circuit, wherein the current selector is connected to an output terminal of the voltage driver. Accordingly, it is possible to achieve a constant output voltage level after the calibration mode is terminated based on selection of an optimal current.

The transceiver may further include a current output module connected to the output terminal of the voltage driver and configured to output the current selected by the current selector in the calibration mode after the calibration mode is terminated. Accordingly, it is possible to achieve a constant output voltage level after the calibration mode is terminated based on selection of an optimal current.

DETAILED DESCRIPTION OF THE PREFERRED EMBODIMENTS

Hereinafter, the present disclosure will be described in detail with reference to the accompanying drawings.

With respect to constituent elements used in the following description, suffixes "module" and "unit" are given only in consideration of ease in the preparation of the specification, and do not have or serve as different meanings. Accordingly, the suffixes "module" and "unit" may be used interchangeably.

Figure 1:
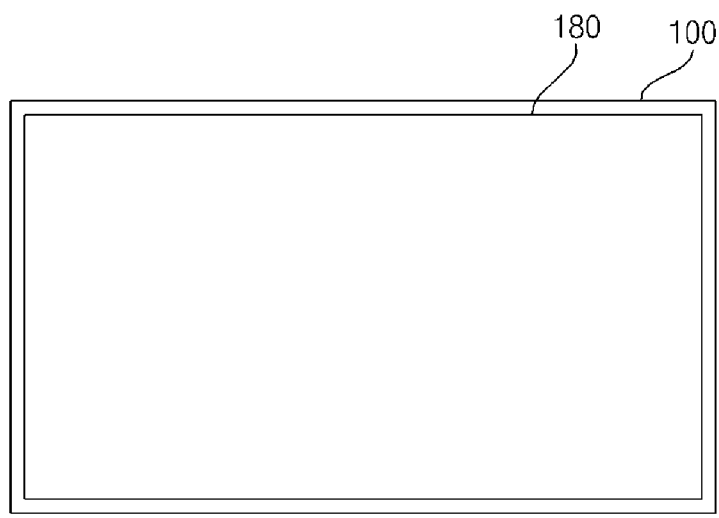
FIG. 1 is a diagram illustrating an image display apparatus according to an embodiment of the present disclosure.

FIG. 1 is a diagram showing an image display apparatus according to an embodiment of the present disclosure.

Referring to the drawing, an image display apparatus 100 may include a display 180.

The display 180 may be implemented with any one of various panels. For example, the display 180 may be any one of a liquid crystal display panel (LCD panel), an organic light emitting diode panel (OLED panel), an inorganic light emitting diode panel (LED panel).

Meanwhile, the image display apparatus 100 in FIG. 1 may be a monitor, a TV, a tablet PC, a mobile terminal, a display for a vehicle, etc.

Figure 2:
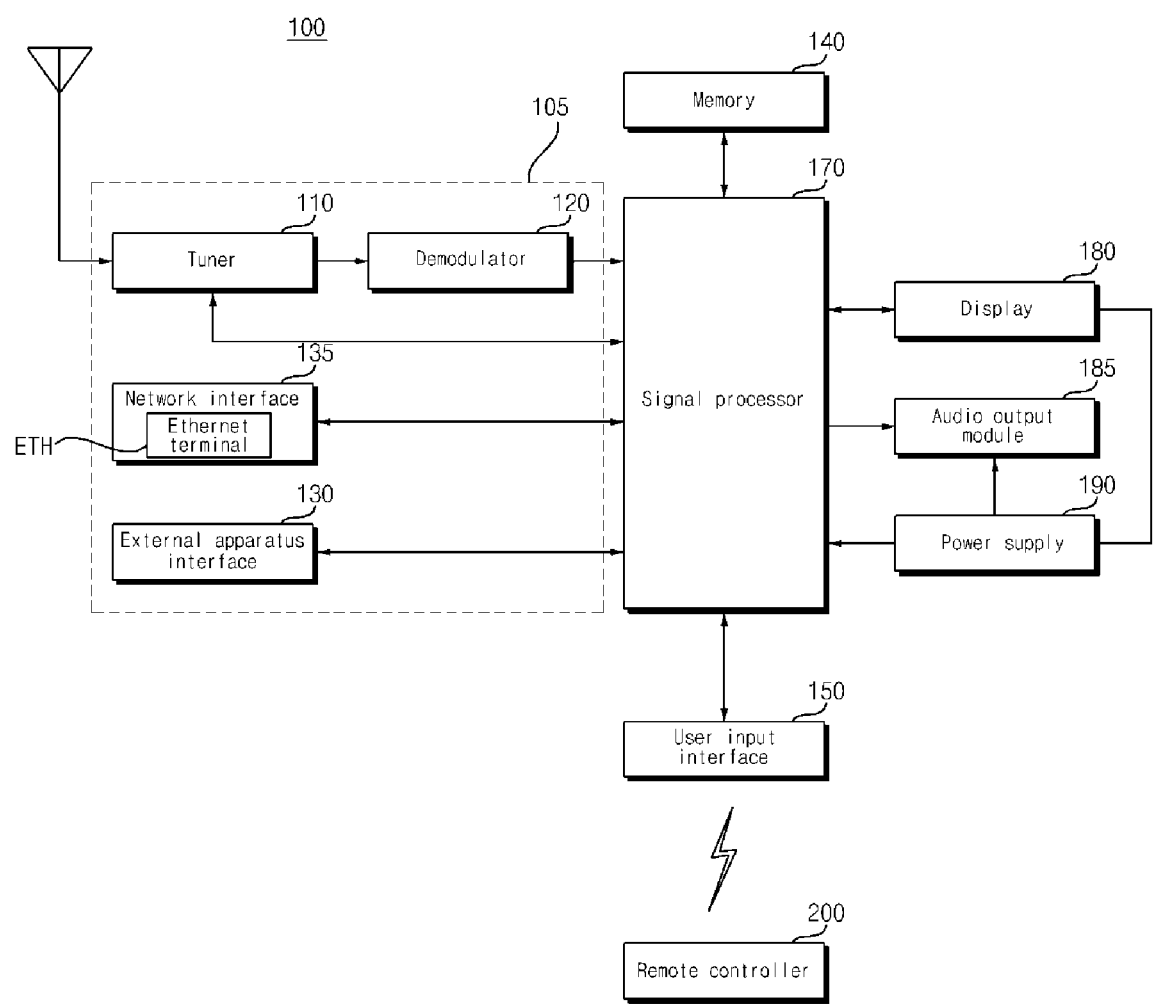
FIG. 2 is an example of an internal block diagram of the image display apparatus of FIG. 1.

FIG. 2 is an example of an internal block diagram of the image display apparatus of FIG. 1.

Referring to FIG. 2, the image display apparatus 100 according to an embodiment of the present disclosure includes an image receiver 105, an external apparatus interface 130, a memory 140, a user input interface 150, a sensor device (not shown), a signal processor 170, a display 180, and an audio output module 185.

The image receiver 105 may include a tuner 110, a demodulator 120, a network interface 135, and an external apparatus interface 130.

Meanwhile, unlike the drawing, the image receiver 105 may include only the tuner 110, the demodulator 120, and the external apparatus interface 130. That is, the network interface 135 may not be included.

The tuner 110 selects an RF broadcast signal corresponding to a channel selected by a user or all prestored channels among radio frequency (RF) broadcast signals received through an antenna (not shown). In addition, the selected RF broadcast signal is converted into an intermediate frequency signal, a baseband image, or an audio signal.

For example, if the selected RF broadcast signal is a digital broadcast signal, it is converted into a digital IF signal (DIF). If the selected RF broadcast signal is an analog broadcast signal, it is converted into an analog baseband image or audio signal (CVBS/SIF). That is, the tuner 110 can process a digital broadcast signal or an analog broadcast signal. The analog baseband image or audio signal (CVBS/SIF) output from the tuner 110 may be directly input to the signal processor 170.

Meanwhile, the tuner 110 can include a plurality of tuners for receiving broadcast signals of a plurality of channels. Alternatively, a single tuner that simultaneously receives broadcast signals of a plurality of channels is also available.

The demodulator 120 receives the converted digital IF signal DIF from the tuner 110 and performs a demodulation operation.

The demodulator 120 may perform demodulation and channel decoding and then output a stream signal TS. At this time, the stream signal may be a multiplexed signal of an image signal, an audio signal, or a data signal.

The stream signal output from the demodulator 120 may be input to the signal processor 170. The signal processor 170 performs demultiplexing, image/audio signal processing, and the like, and then outputs an image to the display 180 and outputs audio to the audio output module 185.

The external apparatus interface 130 may transmit or receive data with a connected external apparatus (not shown), e.g., a settop box 50. To this end, the external apparatus interface 130 may include an A/V input and output module (not shown).

The external apparatus interface 130 may be connected in wired or wirelessly to an external apparatus such as a digital versatile disk (DVD), a Blu ray, a game equipment, a camera, a camcorder, a computer (note book), and a settop box, and may perform an input/output operation with an external apparatus.

The A/V input and output module may receive image and audio signals from an external apparatus. Meanwhile, a wireless communicator (not shown) may perform short range wireless communication with other electronic apparatus.

Through the wireless communicator (not shown), the external apparatus interface 130 may exchange data with an adjacent mobile terminal 600. In particular, in a mirroring mode, the external apparatus interface 130 may receive device information, executed application information, application image, and the like from the mobile terminal 600.

The network interface 135 provides an interface for connecting the image display apparatus 100 to a wired/wireless network including the Internet network.

For example, the network interface 135 may receive or transmit various types of data through an Ethernet terminal (ETH) network.

Meanwhile, the network interface 135 may include a wireless communicator (not shown).

The memory 140 may store a program for each signal processing and control in the signal processor 170, and may store signal processed image, audio, or data signal.

In addition, the memory 140 may serve to temporarily store image, audio, or data signal input to the external apparatus interface 130. In addition, the memory 140 may store information on a certain broadcast channel through a channel memory function such as a channel map.

Although FIG. 2 illustrates that the memory is provided separately from the signal processor 170, the scope of the present disclosure is not limited thereto. The memory 140 may be included in the signal processor 170.

The user input interface 150 transmits a signal input by the user to the signal processor 170 or transmits a signal from the signal processor 170 to the user.

For example, it may transmit/receive a user input signal such as power on/off, channel selection, screen setting, etc., from a remote controller 200, may transfer a user input signal input from a local key (not shown) such as a power key, a channel key, a volume key, a set value, etc., to the signal processor 170, may transfer a user input signal input from a sensor device (not shown) that senses a user's gesture to the signal processor 170, or may transmit a signal from the signal processor 170 to the sensor device (not shown).

The signal processor 170 may demultiplex the input stream through the tuner 110, the demodulator 120, the network interface 135, or the external apparatus interface 130, or process the demultiplexed signals to generate and output a signal for image or audio output.

For example, the signal processor 170 receives a broadcast signal received by the image receiver 105 or an HDMI signal, and perform signal processing based on the received broadcast signal or the HDMI signal to thereby output a processed image signal.

The image signal processed by the signal processor 170 is input to the display 180, and may be displayed as an image corresponding to the image signal. In addition, the image signal processed by the signal processor 170 may be input to the external output apparatus through the external apparatus interface 130.

The audio signal processed by the signal processor 170 may be output to the audio output module 185 as an audio signal. In addition, audio signal processed by the signal processor 170 may be input to the external output apparatus through the external apparatus interface 130.

Although not shown in FIG. 2, the signal processor 170 may include a demultiplexer, an image processor, and the like.

That is, the signal processor 170 may perform a variety of signal processing and thus it may be implemented in the form of a system on chip (SOC). This will be described later with reference to FIG. 3.

In addition, the signal processor 170 can control the overall operation of the image display apparatus 100. For example, the signal processor 170 may control the tuner 110 to control the tuning of the RF broadcast corresponding to the channel selected by the user or the previously stored channel.

In addition, the signal processor 170 may control the image display apparatus 100 according to a user command input through the user input interface 150 or an internal program.

Meanwhile, the signal processor 170 may control the display 180 to display an image. At this time, the image displayed on the display 180 may be a still image or a moving image, and may be a 2D image or a 3D image.

Meanwhile, the signal processor 170 may display a certain object in an image displayed on the display 180. For example, the object may be at least one of a connected web screen (newspaper, magazine, etc.), an electronic program guide (EPG), various menus, a widget, an icon, a still image, a moving image, and a text.

Meanwhile, the signal processor 170 may recognize the position of the user based on the image photographed by a photographing device (not shown). For example, the distance (z-axis coordinate) between a user and the image display apparatus 100 can be determined. In addition, the x-axis coordinate and the y-axis coordinate in the display 180 corresponding to a user position can be determined.

The display 180 generates a driving signal by converting an image signal, a data signal, an OSD signal, a control signal processed by the signal processor 170, an image signal, a data signal, a control signal, and the like received from the external apparatus interface 130.

Meanwhile, the display 180 may be configured as a touch screen and used as an input device in addition to an output device.

The audio output module 185 receives a signal processed by the signal processor 170 and outputs it as an audio.

The photographing device (not shown) photographs a user. The photographing device (not shown) may be implemented by a single camera, but the present disclosure is not limited thereto and may be implemented by a plurality of cameras. Image information photographed by the photographing device (not shown) may be input to the signal processor 170.

The signal processor 170 may sense a gesture of the user based on each of the images photographed by the photographing device (not shown), the signals detected from the sensor device (not shown), or a combination thereof.

The power supply 190 supplies corresponding power to the image display apparatus 100. Particularly, the power may be supplied to a controller 170 which can be implemented in the form of a system on chip (SOC), a display 180 for displaying an image, and an audio output module 185 for outputting an audio.

Specifically, the power supply 190 may include a converter for converting an AC power into a DC power, and a DC/DC converter for converting the level of the DC power.

The remote controller 200 transmits the user input to the user input interface 150. To this end, the remote controller 200 may use Bluetooth, a radio frequency (RF) communication, an infrared (IR) communication, an Ultra Wideband (UWB), ZigBee, or the like. In addition, the remote controller 200 may receive the image, audio, or data signal output from the user input interface 150, and display it on the remote controller 200 or output it as an audio.

Meanwhile, the image display apparatus 100 may be a fixed or mobile digital broadcasting receiver capable of receiving digital broadcasting.

Meanwhile, a block diagram of the image display apparatus 100 shown in FIG. 2 is a block diagram for an embodiment of the present disclosure. Each component of the block diagram may be integrated, added, or omitted according to a specification of the image display apparatus 100 actually implemented. That is, two or more components may be combined into a single component as needed, or a single component may be divided into two or more components. The function performed in each block is described for the purpose of illustrating embodiments of the present disclosure, and specific operation and apparatus do not limit the scope of the present disclosure.

Figure 3:
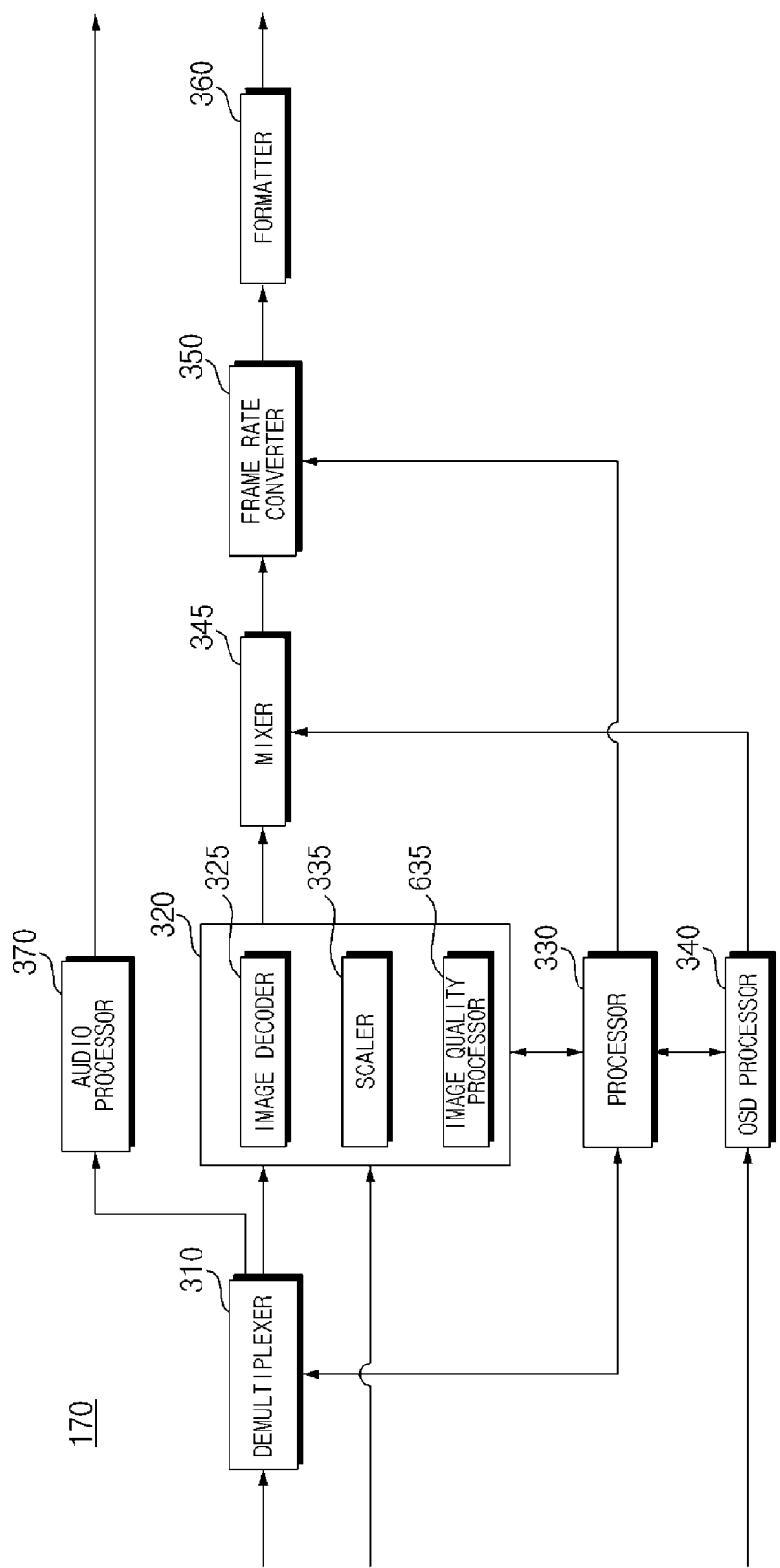
FIG. 3 is an example of an internal block diagram of a signal processor of FIG. 2.

FIG. 3 is an example of an internal block diagram of the signal processor in FIG. 2.

Referring to the drawing, the signal processor 170 according to an embodiment of the present disclosure may include a demultiplexer 310, an image processor 320, a processor 330, and an audio processor 370. In addition, the signal processor 170 may further include and a data processor (not shown).

The demultiplexer 310 demultiplexes the input stream. For example, when an MPEG-2 TS is input, it can be demultiplexed into image, audio, and data signal, respectively. Here, the stream signal input to the demultiplexer 310 may be a stream signal output from the tuner 110, the demodulator 120, or the external apparatus interface 130.

The image processor 320 may perform signal processing on an input image. For example, the image processor 320 may perform image processing on an image signal demultiplexed by the demultiplexer 310.

To this end, the image processor 320 may include an image decoder 325, a scaler 335, an image quality processor 635, an image encoder (not shown), an OSD processor 340, a frame rate converter 350, a formatter 360, etc.

The image decoder 325 decodes a demultiplexed image signal, and the scaler 335 performs scaling so that the resolution of the decoded image signal can be output from the display 180.

The image decoder 325 can include a decoder of various standards. For example, a 3D image decoder for MPEG-2, H.264 decoder, a color image, and a depth image, and a decoder for a multiple view image may be provided.

The scaler 335 may scale an input image signal decoded by the image decoder 325 or the like.

For example, if the size or resolution of an input image signal is small, the scaler 335 may upscale the input image signal, and, if the size or resolution of the input image signal is great, the scaler 335 may downscale the input image signal.

The image quality processor 635 may perform image quality processing on an input image signal decoded by the image decoder 325 or the like.

For example, the image quality processor 625 may perform noise reduction processing on an input image signal, extend a resolution of high gray level of the input image signal, perform image resolution enhancement, perform signal processing based on high dynamic range (HDR), change a frame rate, perform image quality processing suitable for properties of a panel, especially an OLED panel, etc.

The OSD processor 340 generates an OSD signal according to a user input or by itself. For example, based on a user input signal, the OSD processor 340 may generate a signal for displaying various pieces of information as a graphic or a text on the screen of the display 180. The generated OSD signal may include various data such as a user interface screen of the image display apparatus 100, various menu screens, a widget, and an icon. In addition, the generated OSD signal may include a 2D object or a 3D object.

In addition, the OSD processor 340 may generate a pointer that can be displayed on the display, based on a pointing signal input from the remote controller 200. In particular, such a pointer may be generated by a pointing signal processor, and the OSD processor 340 may include such a pointing signal processor (not shown). Obviously, the pointing signal processor (not shown) may be provided separately from the OSD processor 340.

A frame rate converter (FRC) 350 may convert a frame rate of an input image. The FRC 350 may output the input image without changes.

Meanwhile, the formatter 360 may change a format of an input image signal into a format suitable for displaying the image signal on a display and output the image signal in the changed format.

In particular, the formatter 360 may change a format of an image signal to correspond to a display panel.

Meanwhile, the formatter 360 may change the format of the image signal. For example, it may change the format of the 3D image signal into any one of various 3D formats such as a side by side format, a top/down format, a frame sequential format, an interlaced format, a checker box format, and the like.

The processor 330 may control overall operations of the image display apparatus 100 or the signal processor 170.

For example, the processor 330 may control the tuner 110 to control the tuning of an RF broadcast corresponding to a channel selected by a user or a previously stored channel.

In addition, the processor 330 may control the image display apparatus 100 according to a user command input through the user input interface 150 or an internal program.

In addition, the processor 330 may transmit data to the network interface 135 or to the external apparatus interface 130.

In addition, the processor 330 may control the demultiplexer 310, the image processor 320, and the like in the signal processor 170.

Meanwhile, the audio processor 370 in the signal processor 170 may perform the audio processing of the demultiplexed audio signal. To this end, the audio processor 370 may include various decoders.

In addition, the audio processor 370 in the signal processor 170 may process a base, a treble, a volume control, and the like.

The data processor (not shown) in the signal processor 170 may perform data processing of the demultiplexed data signal. For example, when the demultiplexed data signal is a coded data signal, it can be decoded. The encoded data signal may be electronic program guide information including broadcast information such as a start time and an end time of a broadcast program broadcasted on each channel.

Meanwhile, a block diagram of the signal processor 170 shown in FIG. 3 is a block diagram for an embodiment of the present disclosure. Each component of the block diagram may be integrated, added, or omitted according to a specification of the signal processor 170 actually implemented.

In particular, the frame rate converter 350 and the formatter 360 may be provided separately in addition to the image processor 320.

Signals received through an Ethernet terminal ETH may be about 2.5 V or higher according to a standard or the like.

The signal processor 170 is manufactured by a nano-process or the like, and thus an internal allowable voltage is approximately 1.8 V. Therefore, when a voltage signal higher than the internal allowable voltage is input to the signal processor 170 according to the standard, stress applied to the signal processor 170 increases and thus the operation thereof may not be smoothly performed.

Accordingly, when the voltage of an external input signal is higher than the allowable voltage in the signal processor, it is desirable to divide and process the voltage level of the external input signal.

Figure 4:
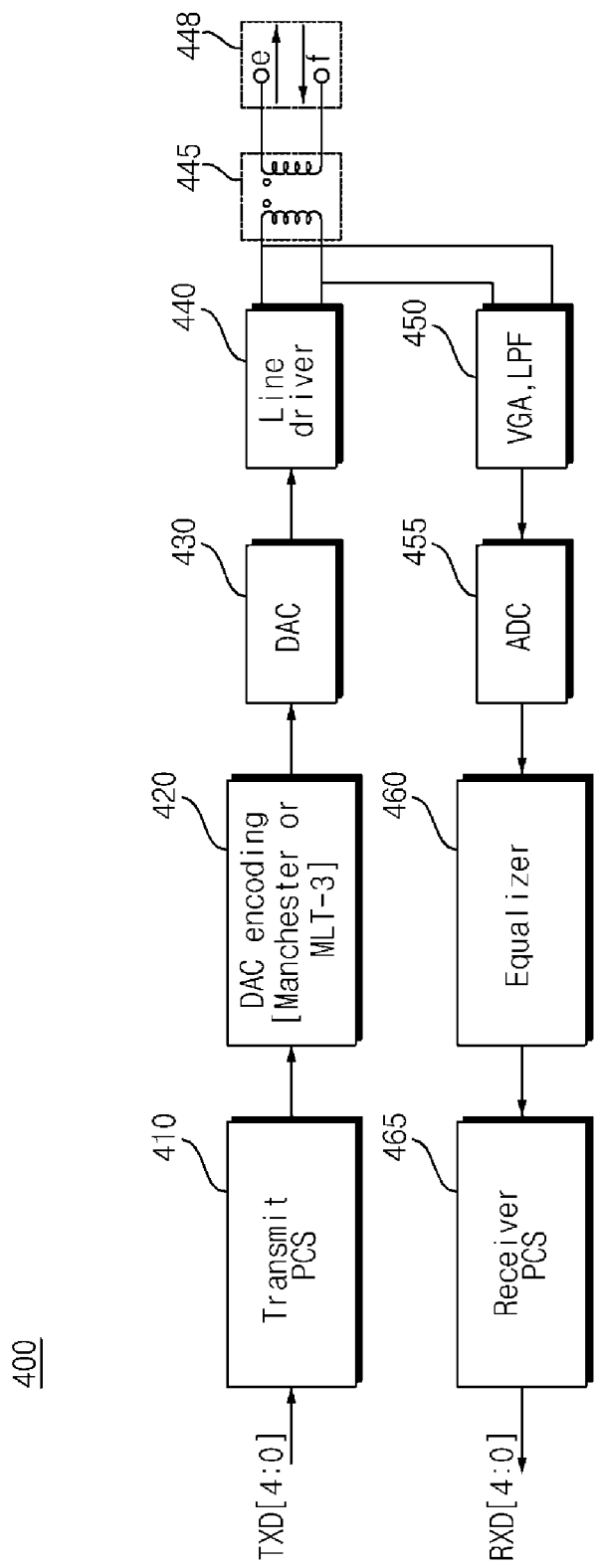
FIG. 4 shows an example of a transceiver for an Ethernet terminal.

FIG. 4 shows an example of a transceiver for an Ethernet terminal.

Referring to the figure, a transceiver 400 for an Ethernet terminal may include a transmitter physical coding sublayer (PCS) 410 for encoding signal transmission, a digital-to-analog encoder (DAC encoding) 420, a digital-to-analog converter (DAC) 430, an output driving circuit (line driver) 440, a transformer 445, an external input/output terminal 448, an amplifier & filter (variable gain amplifier (VGA) & low pass filter (LPF)) 450, an analog-to-digital converter (ADC) 455, an equalizer 460, and a receiver physical coding sublayer (PCS) 465.

The transceiver 400 for an Ethernet terminal of FIG. 4 may be a 10base-T and 100Base-T transceiver.

Figure 5:
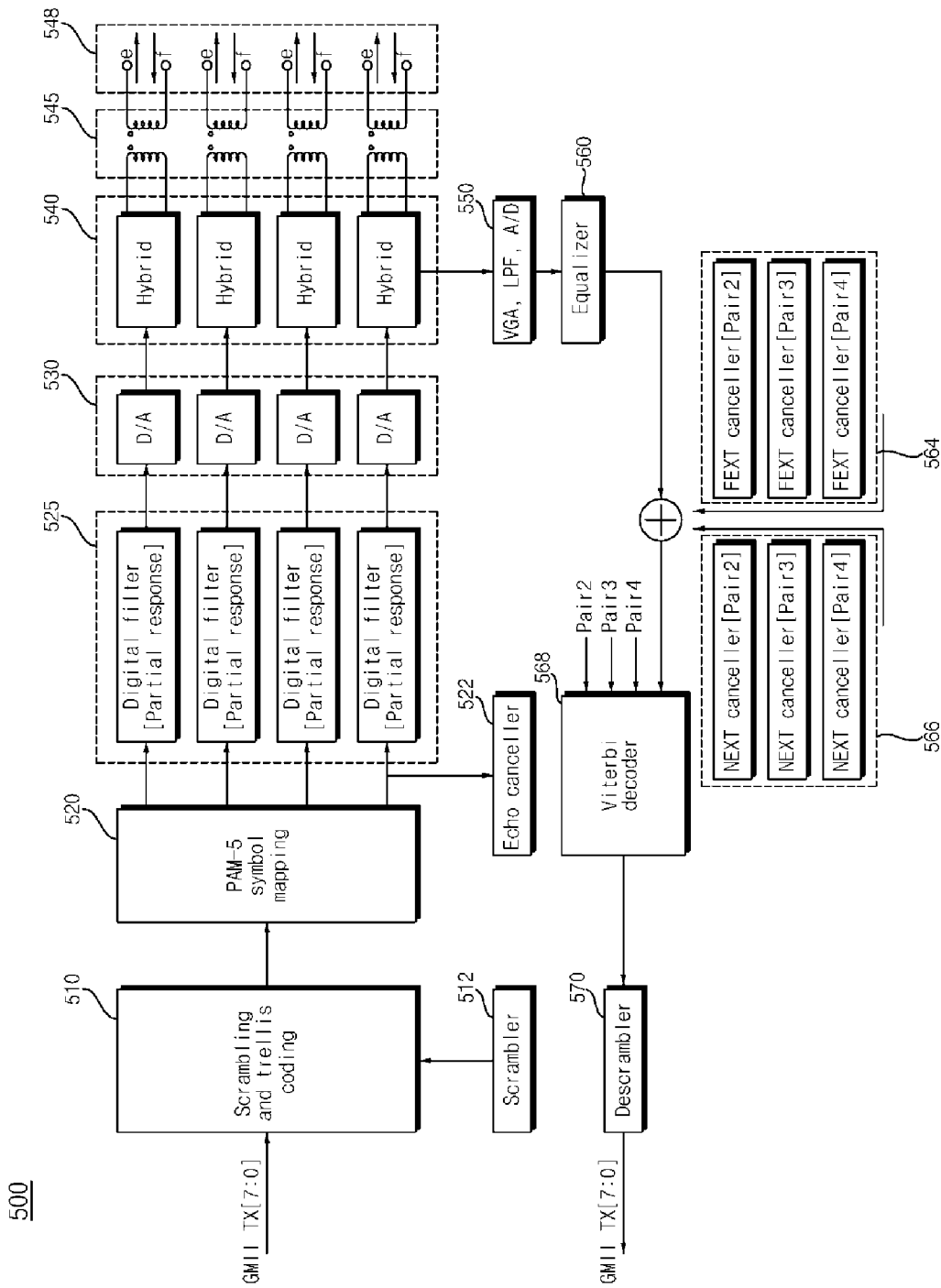
FIG. 5 shows another example of a transceiver for an Ethernet terminal.

FIG. 5 shows another example of a transceiver for an Ethernet terminal.

Referring to the figure, a transceiver 500 for an Ethernet terminal may include a scrambler 512, a scrambling and coding module 510 for encoding signal transmission, a symbol mapper 520, an echo canceller 522, a filter module 525 including a plurality of digital filters, a digital-to-analog conversion module 530 including a plurality of digital-to-analog converters, an output driving circuit 540 including a plurality of line drivers, a transformer module 545 including a plurality of transformers, an input/output module 548 including a plurality of input/output stages, an amplifier, filter and analog-to-digital converter (VGA&LPF&A/D) 550, an equalizer 560, a first canceller module 564 including a plurality of cancellers, a second canceller module 566 including a plurality of cancellers, a decoder 568, and a descrambler 570.

Figure 6A:
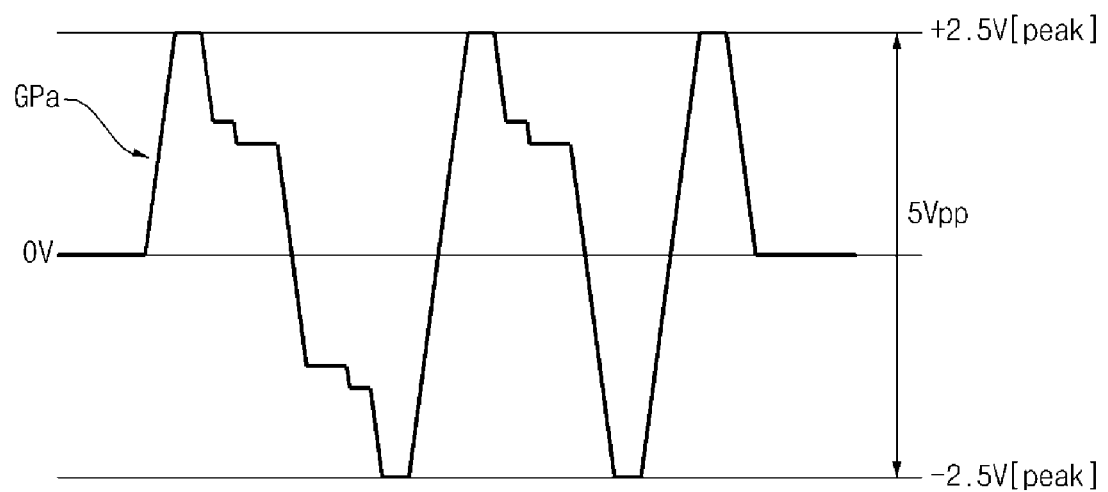
FIG. 6A is a diagram illustrating a signal used in the transceiver of FIG. 4.

FIG. 6A is a diagram illustrating a signal used in the transceiver of FIG. 4.

Referring to the figure, the transceiver 400 of FIG. 4 may be a 10base-T transceiver.

According to the standard of 10base-T, a peak level of a positive polarity of a signal GPa may be approximately 2.5 V, and a peak level of a negative polarity of the signal GPa may be approximately −2.5 V.

That is, a peak-to-peak level of the signal used in the transceiver 400 of FIG. 4 may be approximately 5 V.

Figure 6B:
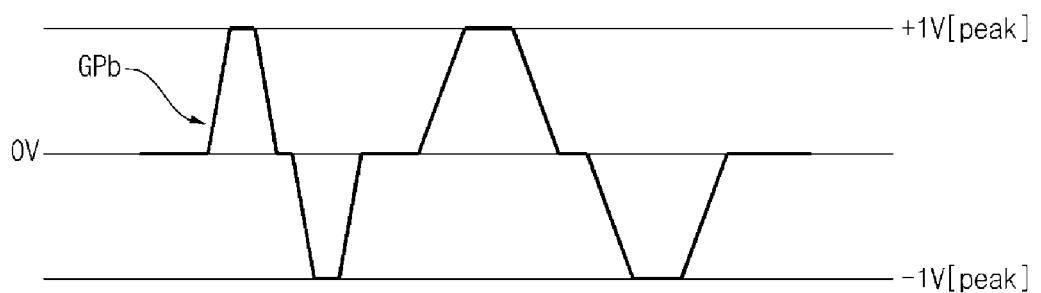
FIG. 6B is a diagram illustrating a signal used in the transceiver of FIG. 4.

FIG. 6B is a diagram illustrating a signal used in the transceiver of FIG. 4.

Referring to the figure, the transceiver 400 of FIG. 4 may be a 100Base-T transceiver.

According to the 100Base-T standard, a peak level of a positive polarity of a signal GPb may be approximately 1 V, and a peak level of a negative polarity of the signal GPb may be approximately −1 V.

That is, a peak-to-peak level of the signal used in the transceiver 400 of FIG. 4 may be approximately 2 V.

Figure 6C:
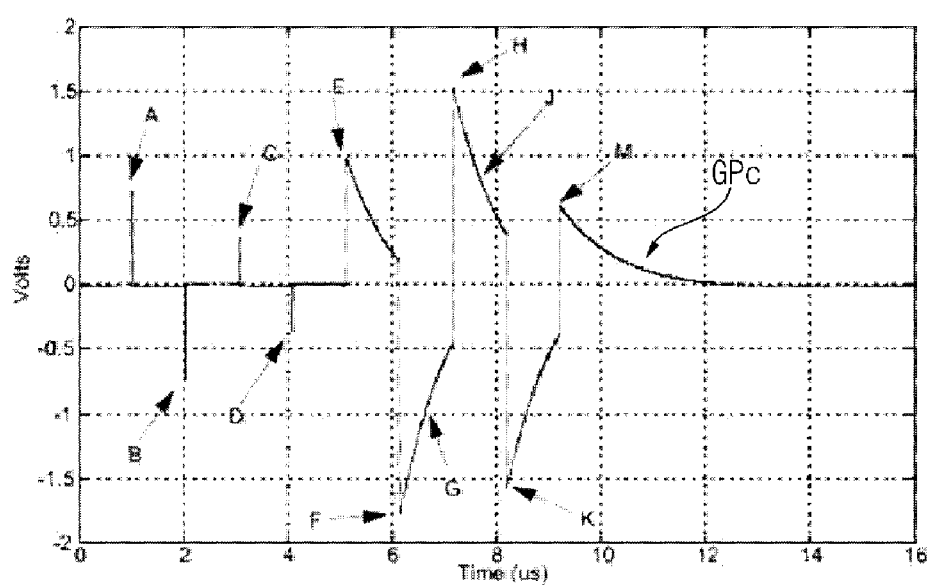
FIG. 6C is a diagram illustrating a signal used in the transceiver of FIG. 5.

FIG. 6C is a diagram illustrating a signal used in the transceiver of FIG. 5.

Referring to the figure, the transceiver 500 of FIG. 5 may be a 1000Base-T transceiver.

Therefore, according to the 1000Base-T standard, a peak level of a positive polarity of a signal GPc may be approximately 1.5 V, and a peak level of a negative polarity of the signal GPc may be approximately −1.5 V.

That is, a peak-to-peak level of the signal used in the transceiver 500 of FIG. 5 may be approximately 3 V.

Figure 7A:
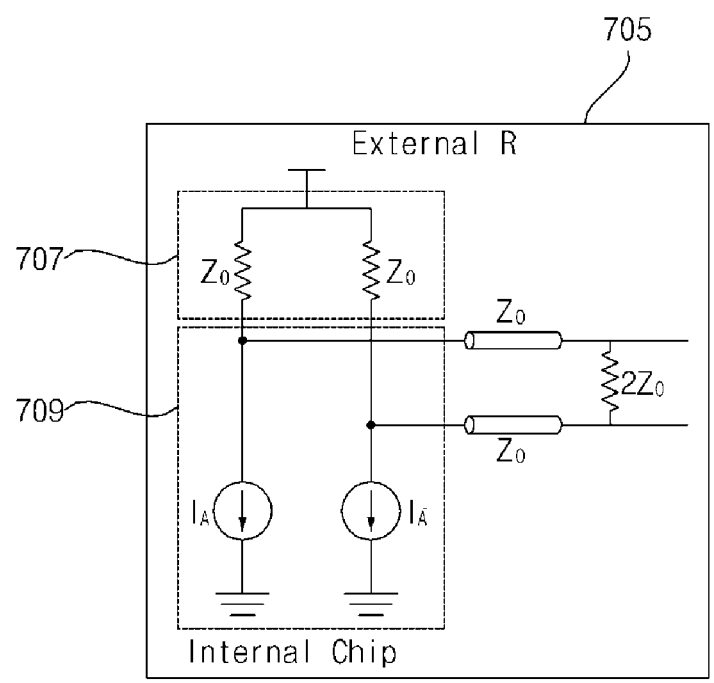
FIGS. 7A and 7B show an example of an output driving circuit of a transceiver.
Figure 7B:
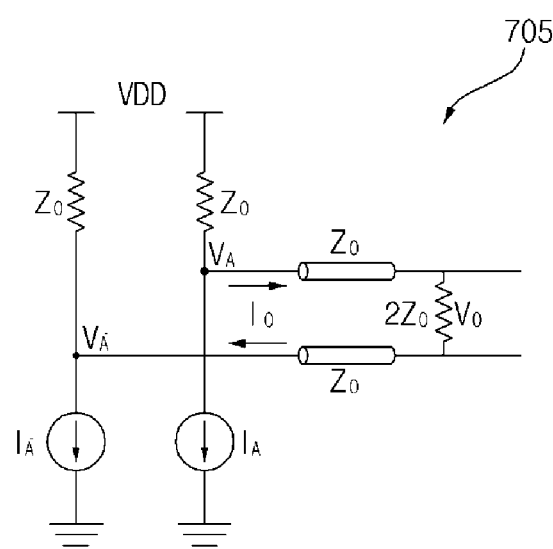

FIGS. 7A and 7B show an example of an output driving circuit of a transceiver.

Referring to the figure, the output driving circuit 705 of the transceiver may be an output driving circuit based on a current mode.

The output driving circuit 705 of the transceiver may include a plurality of impedances 707 connected in parallel and a plurality of current sources 709 respectively connected to the plurality of impedances.

The plurality of impedances 707 and the plurality of current sources 709 may be implemented as an internal chip.

When the 10Base-T transceiver 400 uses such an output driving circuit 705, a current of approximately 100 mA flows.

When the 100Base-T transceiver 400 uses such an output driving circuit 705, a current of approximately 40 mA flows.

Figure 7C:
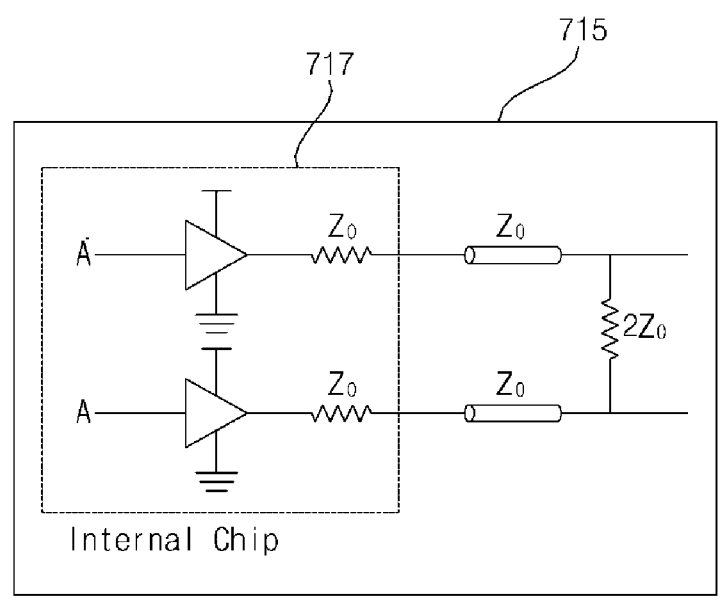
FIGS. 7C and 7D show another example of an output driving circuit of the transceiver.
Figure 7D:
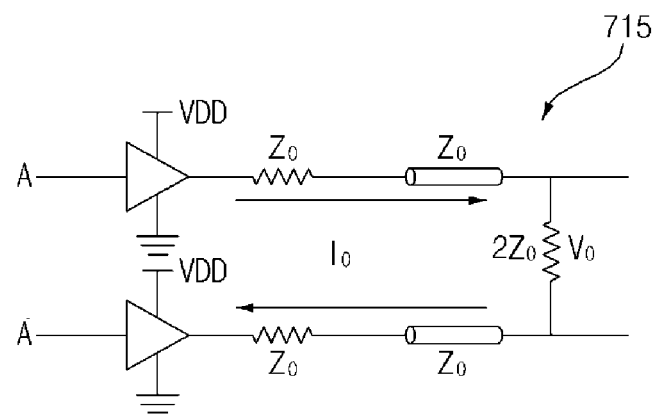

FIGS. 7C and 7D show another example of an output driving circuit of a transceiver.

Referring to the figure, the output driving circuit 715 of the transceiver may be an output driving circuit based on a voltage mode.

In the output driving circuit 715 of the transceiver, a plurality of amplifiers and a plurality of impedances may be connected in series.

The plurality of amplifiers and the plurality of impedances may be implemented as an internal chip.

When the 10Base-T transceiver 400 uses such an output driving circuit 715, a current of approximately 25 mA flows.

When the 100Base-T transceiver 400 uses such an output driving circuit 715, a current of approximately 10 mA flows.

Since current is smaller in the voltage mode-based output driving circuit 715 of FIGS. 7C and 7D than in the current mode-based output driving circuit 705 of FIGS. 7A and 7B, and thus power consumption can be reduced.

Meanwhile, it is desirable to adjust an output voltage level while integrating an external resistor into an internal chip at the time of implementing the voltage mode-based output driving circuit 715.

Figure 8A:
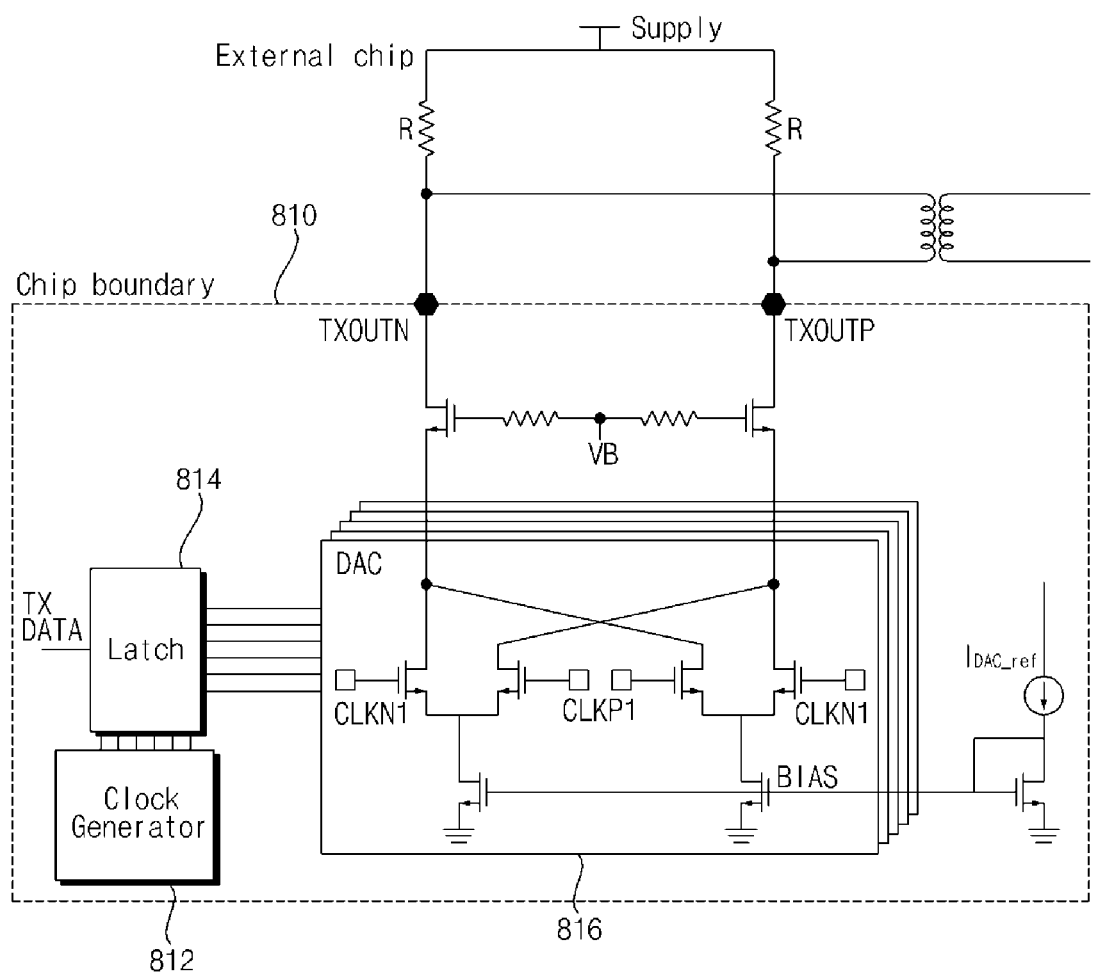
FIGS. 8A to 8C show various examples of a current mode-based output driving circuit.
Figure 8B:
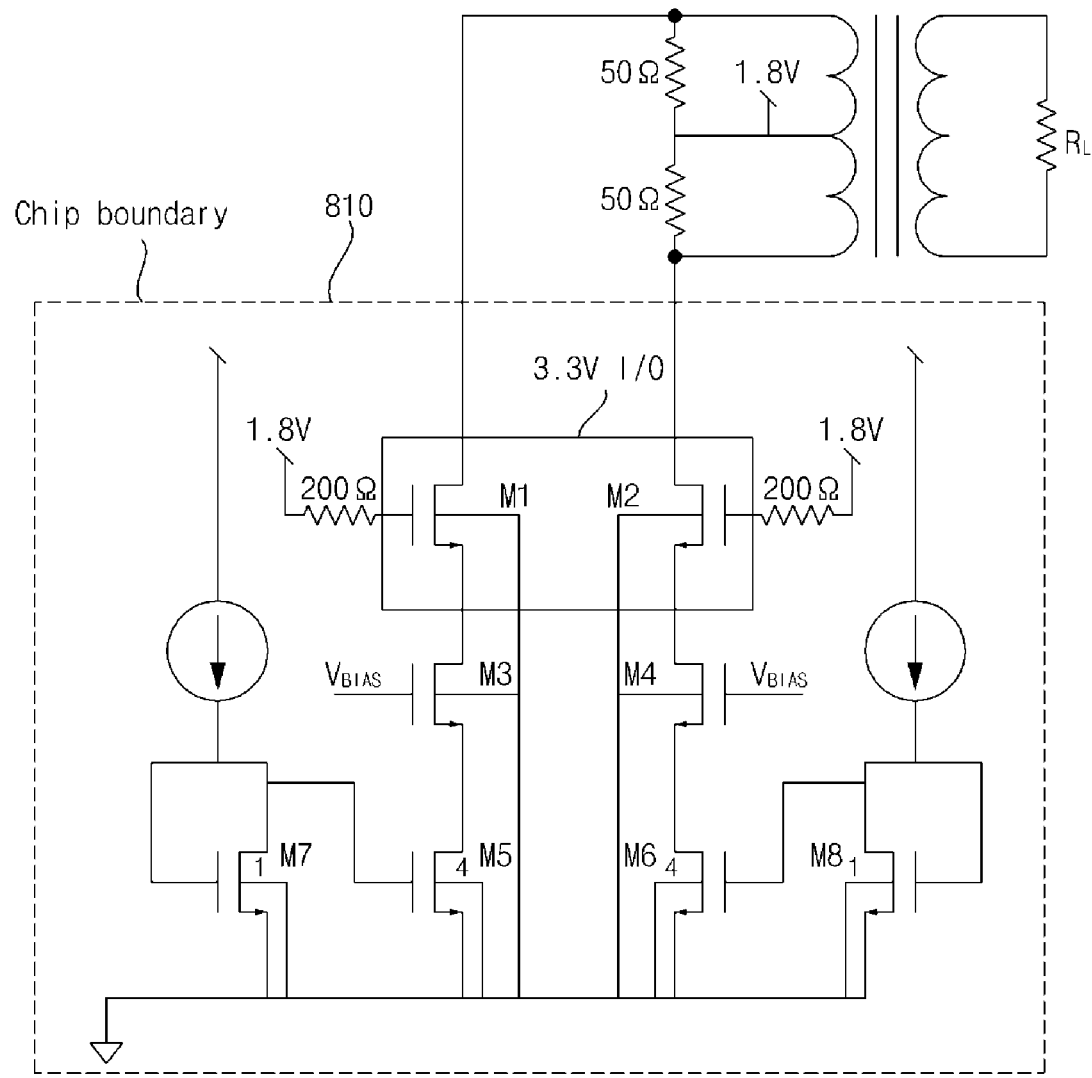
Figure 8C:
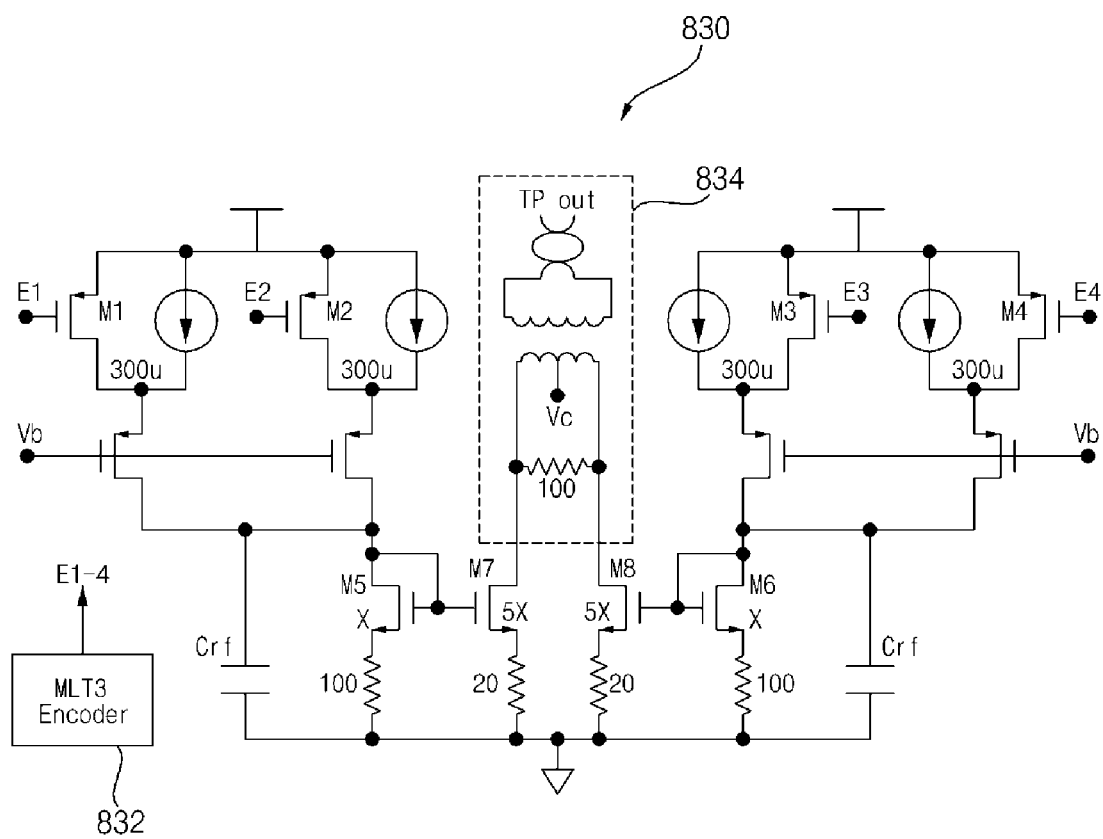

FIGS. 8A to 8C show various examples of a current mode-based output driving circuit.

FIG. 8A illustrates a current mode-based output driving circuit 800 including a clock generator 812, a latch circuit 814, and a digital-to-analog converter 816.

FIG. 8B illustrates a current mode-based output driving circuit 810 including a current mirror, a current source, and the like.

FIG. 8C illustrates the current mode-based output driving circuit 830 including a current mirror, a current source, and the like.

FIGS. 8A to 8C show current mode-based output driving circuits that can use a constant current and an external resistor through a band gap reference (BGR) of internal chips and thus have constant output voltage levels. However, these output driving circuits have high current consumption for a desired output voltage level.

Figure 9A:
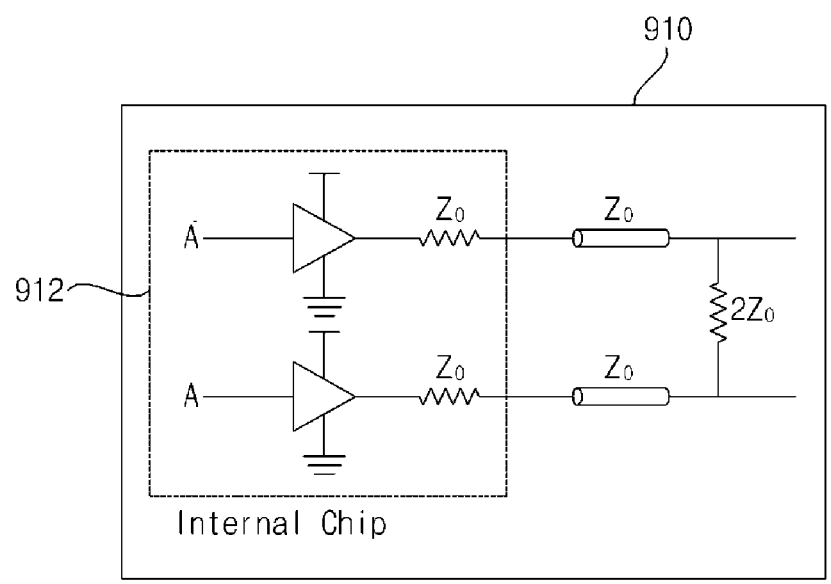
FIGS. 9A to 9C are diagrams referred to in description of a voltage mode-based output driving circuit.
Figure 9B:
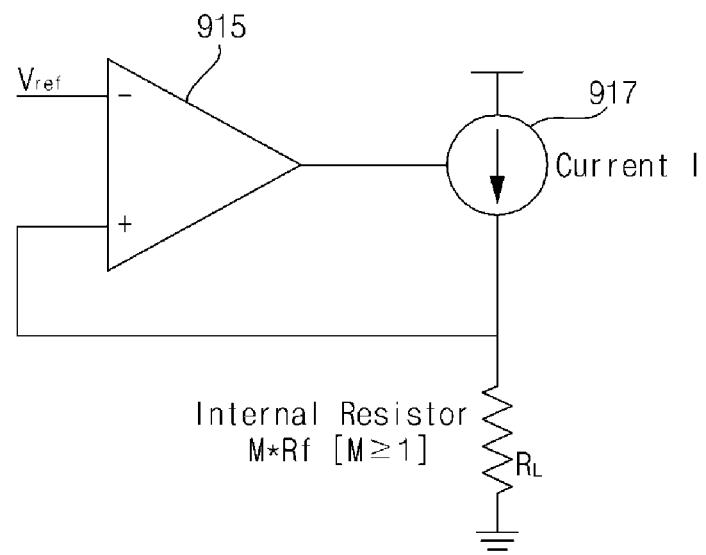
Figure 9C:
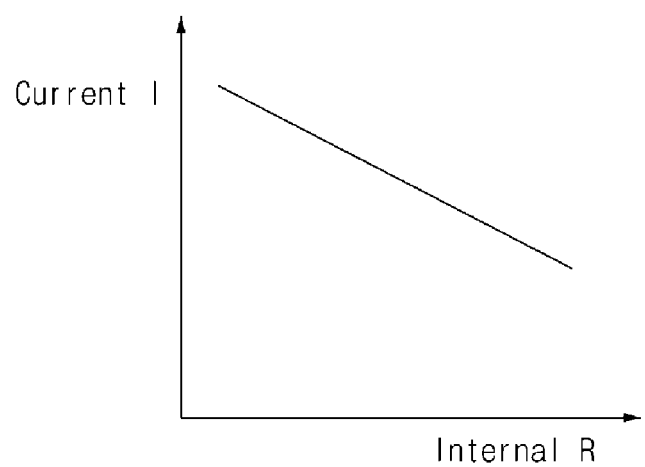

FIGS. 9A to 9C are diagrams referred to in description of a voltage mode-based output driving circuit.

An output driving circuit 910 of a transceiver of FIG. 9A may be an output driving circuit based on a voltage mode.

In the output driving circuit 910 of the transceiver, a plurality of amplifiers and a plurality of impedances may be connected in series.

The plurality of amplifiers and the plurality of impedances may be implemented as an internal chip 912.

When resistors are connected in series as shown in FIG. 9A, if an external voltage peak is 1 Vpp, the internal chip 912 need to output 2 Vpp for output swing.

In view of this, there is also a method of using an internal resistor in an internal chip instead of an external resistor. Accordingly, it is not necessary to use the external resistor, and thus current can be reduced. However, there may be a disadvantage that the output voltage level is not constant.

Referring to FIG. 9B, in the voltage mode-based output driving circuit, a current can be generated using a comparator 915, a current source 917, and an internal resistor RL.

FIG. 9C is a diagram illustrating a current change according to variation in the resistance value of the internal resistor RL.

According to FIG. 9B, a current opposite to variation in the internal resistance may be generated in the voltage mode. Accordingly, the output voltage level may be constant.

However, the output voltage level is changed due to variation or mismatch in a bias or a transistor used based on a current generated when two internal resistors do not exactly match.

In particular, since the circuit of FIG. 9B is always on, current consumption can be reduced by using large internal resistance, and accordingly, a difference from a reference resistance increases, making matching more difficult.

Figure 10:
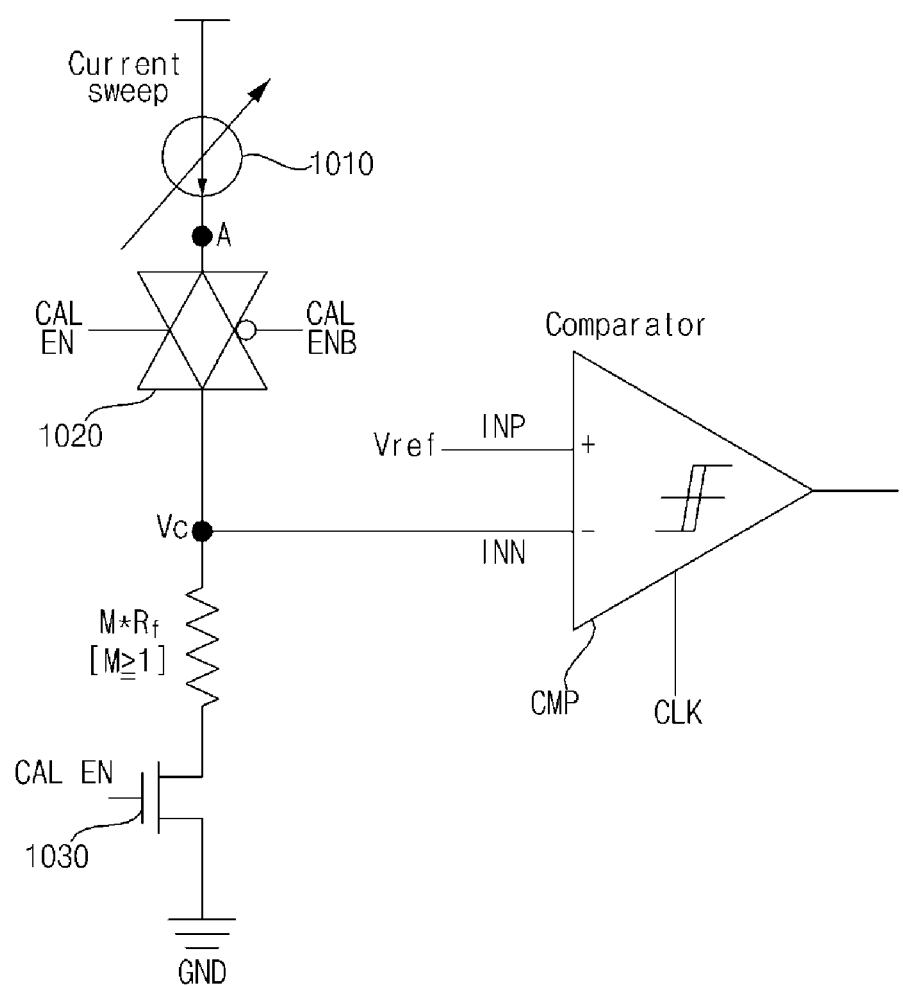
FIG. 10 shows an example of a calibration circuit according to an embodiment of the present disclosure.

FIG. 10 shows an example of a calibration circuit according to an embodiment of the present disclosure.

Referring to the figure, the calibration circuit 1000 in the output driving circuit of the transceiver may include a current sweep circuit 1010 outputting a plurality of sweep currents, a current selector 1020 that is connected to the current sweep circuit and selects an optimal current from the plurality of sweep currents based on comparison with a reference voltage, and a comparator CMP that compares a voltage corresponding to a current output from the current selector 1020 with the reference voltage.

The calibration circuit 1000 of the transceiver may further include a resistor M*Rf connected between an output terminal of the current selector 1020 and a ground terminal GND and a switch 1030 that performs switching.

The voltage Vc in the figure is determined by the current selected by the current selector 1020 and the resistance value of the resistor M*Rf, and the comparator CMP may compare the voltage Vc with the reference voltage.

The resistance value of the resistor M*Rf in the figure can match a resistance value Rf, and accordingly, a constant swing level can be maintained.

The output of the comparator CMP can be fed back and input to the input terminal of the current selector 1020.

Accordingly, the comparator CMP compares the voltage Vc corresponding to the plurality of sweep currents with the reference voltage, a comparison result is input to the current selector 1020, and the current selector 1020 selects and output an optimal current.

Meanwhile, it is preferable that the calibration circuit 1000 in the figure operate only in a calibration mode to reduce power consumption.

Accordingly, the calibration circuit 1000 in the figure may consume a large amount of current during operation.

As a result, the calibration circuit 1000 can calibrate and output the reference current to be used in the digital-to-analog converter (DAC) of FIG. 4 or 5.

In addition, the calibration circuit 1000 may continue to output the calibrated current after the calibration mode is terminated.

Figure 11:
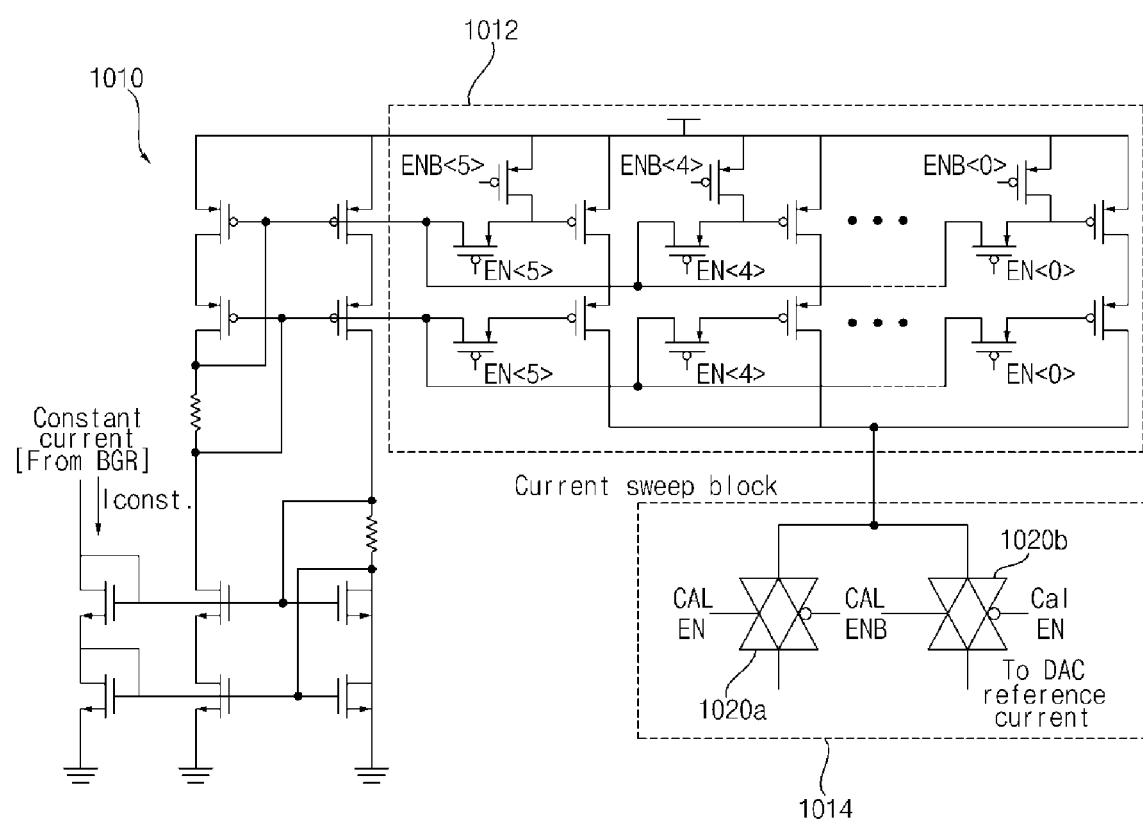
FIG. 11 shows an example of an internal circuit diagram of a current sweep circuit of FIG. 10.

FIG. 11 is an example of an internal circuit diagram of the current sweep circuit of FIG. 10.

Referring to the figure, the current sweep circuit 1010 may receive a constant current from a band gap reference (BGR) of an internal chip and sequentially output a plurality of sweep currents through a current sweep module 1012 including a plurality of switches.

Meanwhile, the plurality of sweep currents may be output to a bias circuit 1014.

The bias circuit 1014 may include a current selector 1020 that operates in the calibration mode to select and output any one of a plurality of sweep currents, and a current output module 1020b that operates after the calibration mode is terminated to convert the selected current as a reference current of the DAC of FIG. 4 or 5.

As a result, according to FIGS. 10 and 11, it is possible to maintain a constant swing level by the calibration circuit 1000 and to achieve a constant output voltage level in the voltage mode despite variation in the bias or transistors.

Figure 12:
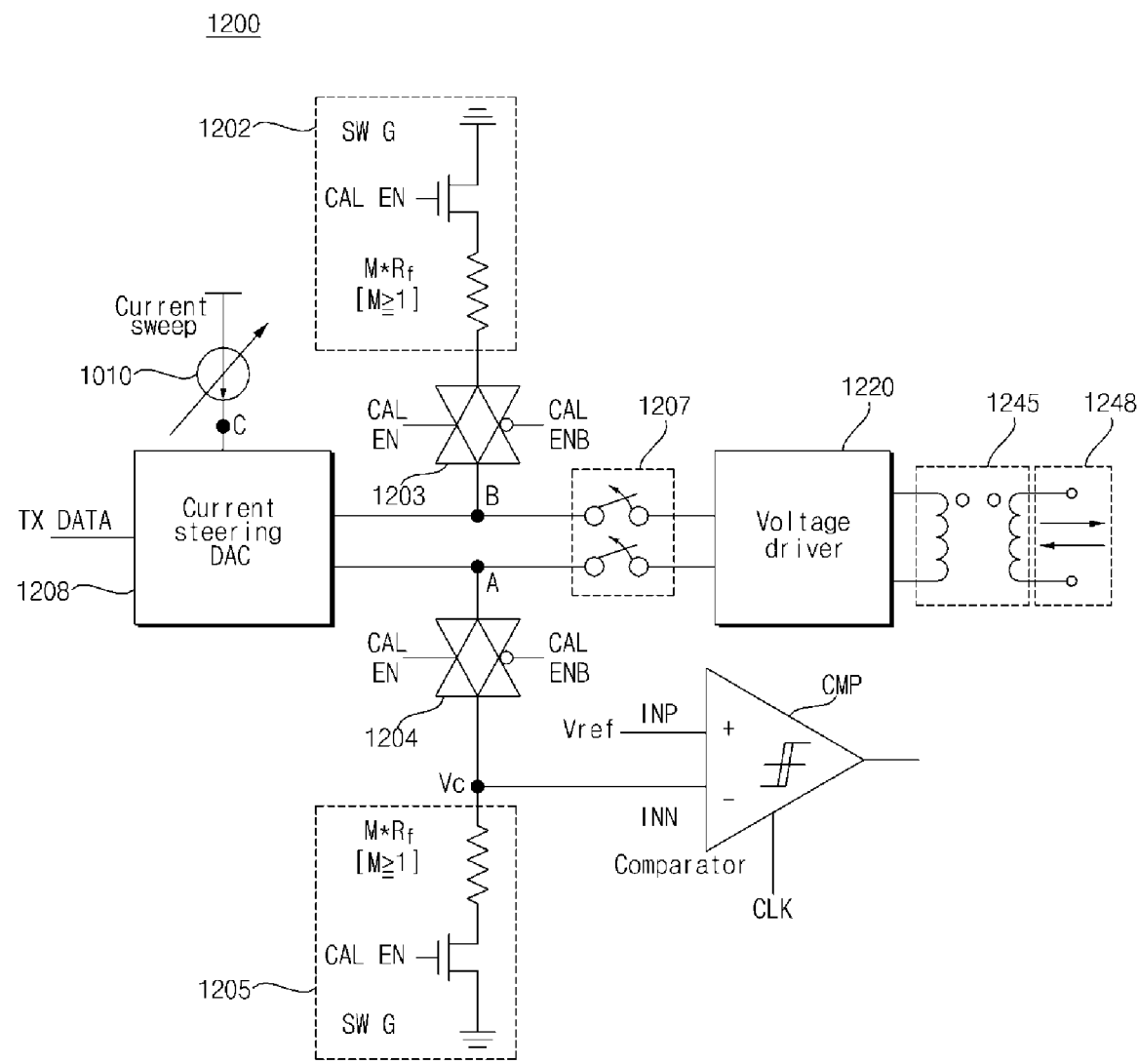
FIG. 12 shows an example of an output driving circuit of a transceiver according to an embodiment of the present disclosure.

FIG. 12 shows an example of an output driving circuit of a transceiver according to an embodiment of the present disclosure.

Referring to the figure, the output driving circuit 1200 of the transceiver according to an embodiment of the present disclosure may be an output driving circuit for data transmission.

The output driving circuit 1200 of the transceiver may include a current sweep circuit 1010 that outputs a plurality of sweep currents, a current steering digital-to-analog conversion circuit 1208 that outputs a plurality of sweep currents in a calibration mode, and converts and outputs transmission data (TX data) after the calibration mode is terminated, a current selector 1204 that selects an optimal current from the plurality of sweep currents based on comparison with a reference voltage, and a comparator CMP that compares a voltage corresponding to the current output from the current selector 1020 with the reference voltage.

Further, the output driving circuit 1200 of the transceiver may include a current output module 1203 that outputs a selected current after the calibration mode is terminated, a switch 1207 that switches the current output from the current selector 1204 or the current output module 1203, a voltage driver 1220 that operates in a voltage mode based on the current output from the current selector 1204 or the current output module 1203, a transformer 1245, and an external input/output terminal 1248.

In addition, the output driving circuit 1200 of the transceiver may further include a voltage generator 1205 including a resistor M*Rf connected between an output terminal of the current selector 1204 and a ground terminal and a switch that performs switching, and a second voltage generator including a resistor M*Rf connected between an output terminal of the current output module 1203 and the ground terminal and a switch that performs switching.

Accordingly, in the calibration mode, a plurality of sweep currents from the current sweep circuit 1010 is input to the current selector 1020 through the current steering digital-to-analog conversion circuit 1208, and the current selector 1020 operates to select an optimal current through comparison with the reference voltage.

After the calibration mode is terminated, the current selector 1020 and the current sweep circuit 1010 stop operations thereof, the current steering digital-to-analog conversion circuit 1208 converts and outputs transmission data (TX data), the current output module 1203 continues to output the selected current, and eventually the voltage driver 1220 can output a signal related to the transmission data to the transformer 1245 and the external input/output terminal 1248 using the selected optimal current.

As a result, according to FIG. 12, a constant swing level can be maintained by the output driving circuit 1200 of the transceiver, and the constant output voltage level can be achieved in the voltage mode despite variation in the bias or transistors.

Figure 13:
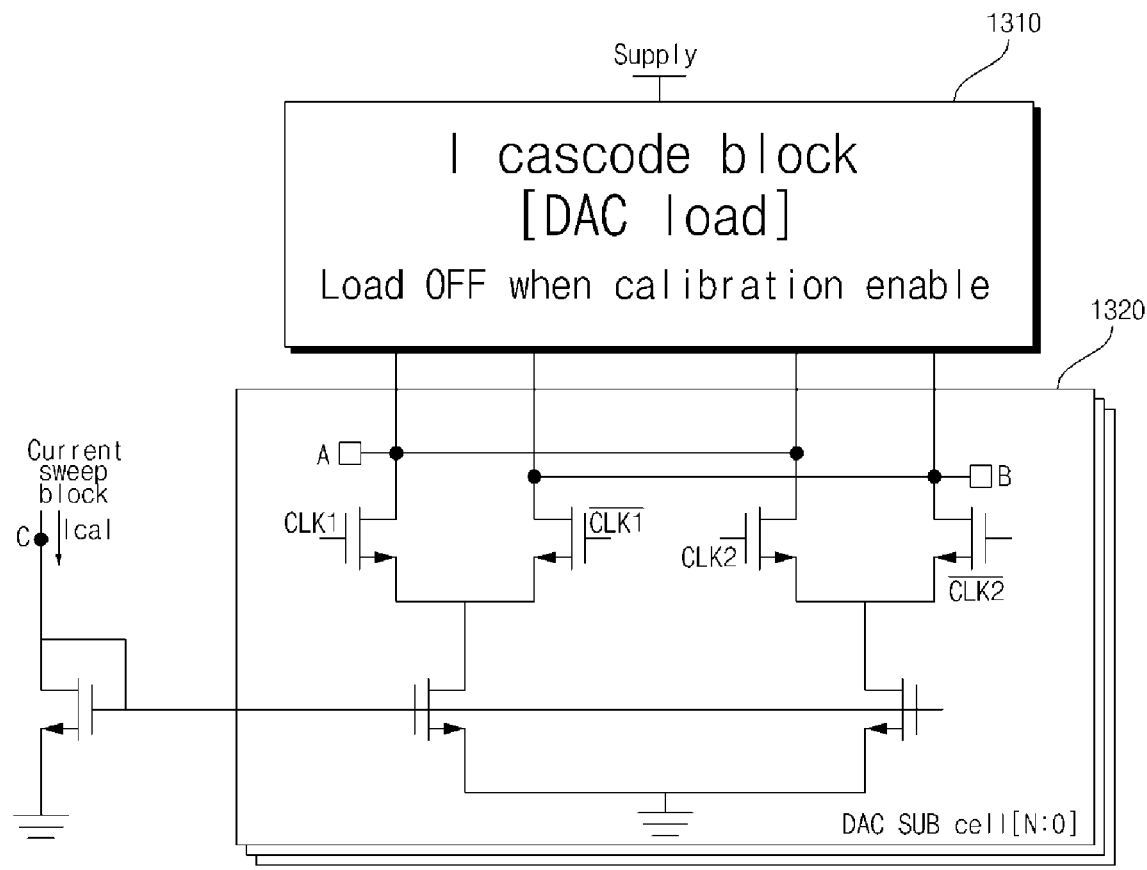
FIG. 13 shows an example of an internal circuit diagram of a current steering digital-to-analog conversion circuit.

FIG. 13 is an example of an internal circuit diagram of a current steering digital-to-analog conversion circuit.

Referring to the figure, the current steering digital-to-analog conversion circuit 1208a may include a current cascade module 1310 turned off in the calibration mode, and a digital-to-analog converter 1320 that converts a digital signal into an analog signal.

The digital-to-analog converter 1320 may include a plurality of switches, and although an NMOS type is illustrated in the figure, the digital-to-analog converter 1320 is not limited thereto and a PMOS type is also possible.

Meanwhile, the digital-to-analog converter 1320 may be implemented as a single polarity current cell.

The current steering digital-to-analog conversion circuit 1208a outputs a plurality of sweep currents in the calibration mode, and after the calibration mode is terminated, converts transmission data into an analog signal and outputs the analog signal.

Figure 14:
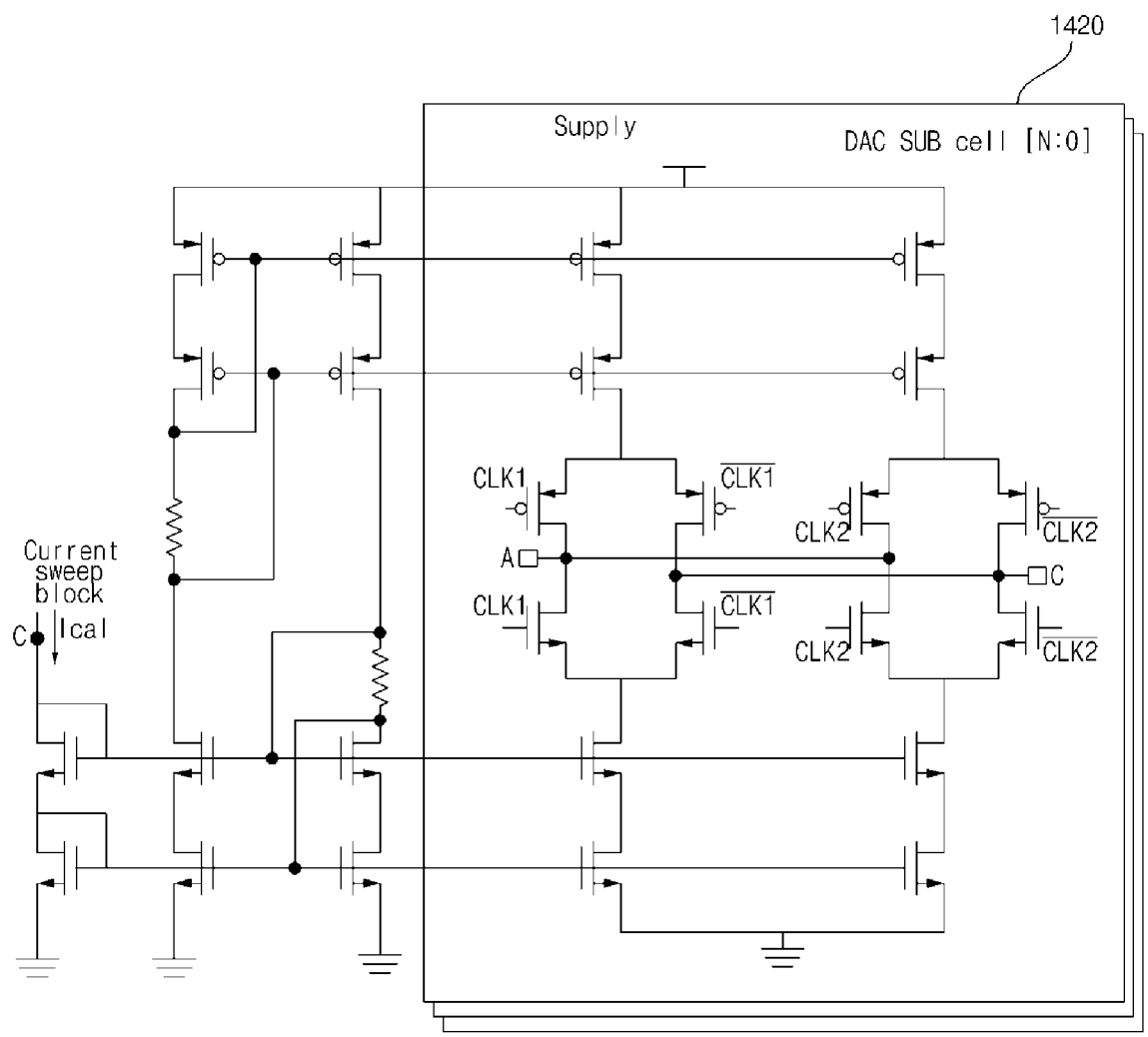
FIG. 14 shows another example of an internal circuit diagram of a current steering digital-to-analog conversion circuit.

FIG. 14 is another example of an internal circuit diagram of a current steering digital-to-analog conversion circuit.

Referring to the figure, the current steering digital-to-analog conversion circuit 1208b may include a digital-to-analog converter 1420 that converts a digital signal into an analog signal.

The digital-to-analog converter 1420 may include a plurality of switches, and although an NMOS type is illustrated in the figure, the digital-to-analog converter 1420 is not limited thereto, and a PMOS type is also possible.

Meanwhile, the digital-to-analog converter 1420 may be implemented as a dual polarity current cell.

The current steering digital-to-analog conversion circuit 1208b outputs a plurality of sweep currents in the calibration mode, and after the calibration mode is terminated, converts transmission data into an analog signal and outputs the analog signal.

Figure 15:
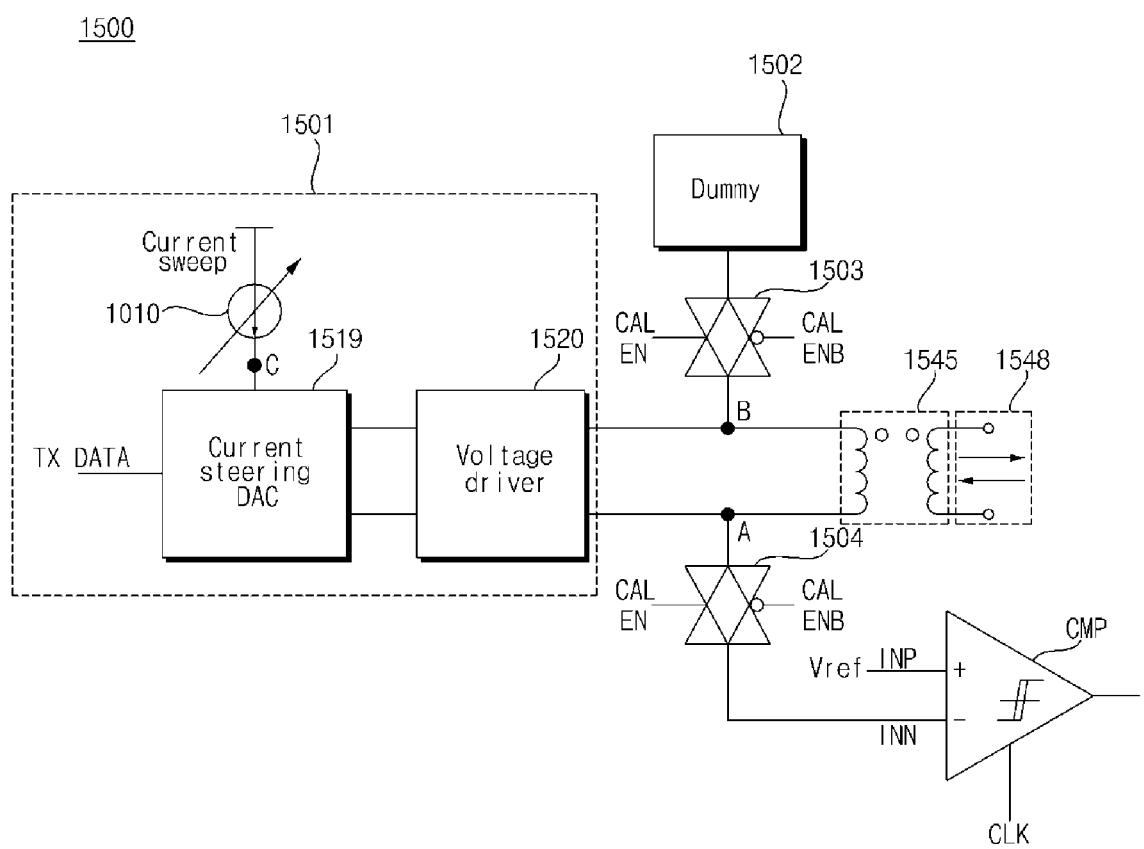
FIG. 15 shows another example of an output driving circuit of a transceiver according to an embodiment of the present disclosure.

FIG. 15 shows another example of an output driving circuit of a transceiver according to an embodiment of the present disclosure.

Referring to the figure, the output driving circuit 1500 of the transceiver according to an embodiment of the present disclosure may be an output driving circuit for data transmission.

The output driving circuit 1500 of the transceiver may include a current sweep circuit 1010 that outputs a plurality of sweep currents, outputs a plurality of sweep currents in a calibration mode, a current steering digital-to-analog conversion circuit 1519 that outputs a plurality of sweep currents in the calibration mode, and after the calibration mode is terminated, converts and outputs transmission data (TX data), a voltage driver 1520 operating in a voltage mode, a transformer 1545, and an external input/output terminal 1548.

The output driving circuit 1500 of the transceiver of FIG. 15 differs from the output driving circuit 1200 of the transceiver of FIG. 12 in that a current selector 1504 or the like is connected to the output terminal of the voltage driver 1520.

The output driving circuit 1500 of the transceiver includes the current selector 1504 that selects an optimal current from a plurality of sweep currents based on comparison with a reference voltage, and a comparator CMP that compares a voltage corresponding to the current output from the current selector 1504 with the reference voltage.

The output driving circuit 1500 of the transceiver may further include a current output module 1503 that outputs the selected current after the calibration mode is terminated.

Accordingly, in the calibration mode, a plurality of sweep currents from the current sweep circuit 1010 is input to the current selector 1020 through the current steering digital-to-analog conversion circuit 1519 and the voltage driver 1520, and the current selector 1020 operates to select an optimal current through comparison with the reference voltage.

In addition, after the calibration mode is terminated, the current selector 1020 and the current sweep circuit 1010 stop the operations thereof, the current steering digital-to-analog conversion circuit 1519 converts and outputs transmission data (TX data), the current output device 1503 continues to output the selected current, and a signal related to the transmission data can be output to the transformer 1545 and the external input/output terminal 1548 using the selected optimal current.

As a result, according to FIG. 15, a constant swing level can be maintained by the output driving circuit 1500 of the transceiver, and the constant output voltage level can be achieved in the voltage mode despite variation in the bias or transistors.

Meanwhile, the calibration circuit 100 or the output driving circuits 1200 and 1500 described with reference to FIGS. 10 to 16 may be included in a transceiver connected to the Ethernet terminal. In this case, the transceiver may be the transceiver of FIG. 4 or FIG. 5.

In addition, the transceivers of FIGS. 4, 5, and 10 to 16 may be provided in the signal processing device 170 of FIG. 2 or additionally provided between the Ethernet terminal ETH and the signal processing device 170.

While the present disclosure has been particularly shown and described with reference to exemplary embodiments thereof, it is clearly understood that the same is by way of illustration and example only and is not to be taken in conjunction with the present disclosure. It will be understood by those skilled in the art that various changes in form and details may be made therein without departing from the subject matter and scope of the present disclosure.

What is claimed is:

1. A signal processing device comprising a transceiver, wherein the transceiver includes:
a current sweep circuit configured to output a plurality of sweep currents;
a current selector connected to the current sweep circuit and configured to select a predetermined current from the plurality of sweep currents based on comparison with a reference voltage;
a comparator configured to compare a voltage output from the current selector with the reference voltage; and a digital-to-analog conversion circuit configured to output a sweep current from the current sweep circuit in a calibration mode and to convert and output transmission data after the calibration mode is terminated.

2. The signal processing device of claim 1, wherein the transceiver further includes a resistor connected between an output terminal of the current selector and a ground terminal, and a switch configured to perform switching.

3. The signal processing device of claim 2, wherein the comparator compares voltages corresponding to a current output from the current selector and a resistance value of the resistor with the reference voltage and feeds back a comparison result to the current selector.

4. The signal processing device of claim 1, wherein the current sweep circuit sequentially outputs the plurality of sweep currents in the calibration mode.

5. The signal processing device of claim 1, wherein the transceiver further includes a current output module configured to output the current selected by the current selector in the calibration mode after the calibration mode is terminated.

6. The signal processing device of claim 5, wherein the transceiver further includes:
a switch configured to switch the current output from the current selector or the current output module; and
a voltage driver operating in a voltage mode based on the current output from the current selector or the current output module.

7. The signal processing device of claim 5, wherein the transceiver further includes:
a voltage generator including a resistor connected between the output terminal of the current selector and a ground terminal and a switch configured to perform switching; and
a second voltage generator including a second resistor connected between an output terminal of the current output module and the ground terminal and a second switch configured to perform switching.

8. The signal processing device of claim 1, wherein the current selector and the current sweep circuit stop operations after the calibration mode is terminated.

9. The signal processing device of claim 1, further comprising a voltage driver disposed at an output terminal of the digital-to-analog conversion circuit,
wherein the current selector is connected to an output terminal of the voltage driver.

10. The signal processing device of claim 9, wherein the transceiver further includes a current output module connected to the output terminal of the voltage driver and configured to output the current selected by the current selector in the calibration mode after the calibration mode is terminated.

11. An image display apparatus comprising:
a display; and
a signal processor configured to output display data to the display,
wherein the signal processor includes a transceiver,
wherein the transceiver includes:
a current sweep circuit configured to output a plurality of sweep currents;

a current selector connected to the current sweep circuit and configured to select a predetermined current from the plurality of sweep currents based on comparison with a reference voltage;
a comparator configured to compare a voltage output from the current selector with the reference voltage; and
a digital-to-analog conversion circuit configured to output a sweep current from the current sweep circuit in a calibration mode and to convert and output transmission data after the calibration mode is terminated.

12. The image display apparatus of claim 11, wherein the transceiver further includes a resistor connected between an output terminal of the current selector and a ground terminal, and a switch configured to perform switching.

13. The image display apparatus of claim 12, wherein the comparator compares voltages corresponding to a current output from the current selector and a resistance value of the resistor with the reference voltage and feeds back a comparison result to the current selector.

14. The image display apparatus of claim 11, wherein the current sweep circuit sequentially outputs the plurality of sweep currents in the calibration mode.

15. The image display apparatus of claim 11, wherein the transceiver further includes a current output module configured to output the current selected by the current selector in the calibration mode after the calibration mode is terminated.

16. The image display apparatus of claim 15, wherein the transceiver further includes:
a switch configured to switch the current output from the current selector or the current output module; and
a voltage driver operating in a voltage mode based on the current output from the current selector or the current output module.

17. The image display apparatus of claim 15, wherein the transceiver further includes:
a voltage generator including a resistor connected between the output terminal of the current selector and a ground terminal and a switch configured to perform switching; and
a second voltage generator including a second resistor connected between an output terminal of the current output module and the ground terminal and a second switch configured to perform switching.

18. The image display apparatus of claim 11, wherein the current selector and the current sweep circuit stop operations after the calibration mode is terminated.

19. A signal processing device comprising a transceiver, wherein the transceiver includes:
a current sweep circuit configured to output a plurality of sweep currents;
a current selector connected to the current sweep circuit and configured to select a predetermined current from the plurality of sweep currents based on comparison with a reference voltage; and
a comparator configured to compare a voltage output from the current selector with the reference voltage,
wherein the current sweep circuit sequentially outputs the plurality of sweep currents in a calibration mode.

* * * * *